(12) United States Patent
Ogura et al.

(10) Patent No.: US 6,631,088 B2
(45) Date of Patent: Oct. 7, 2003

(54) TWIN MONOS ARRAY METAL BIT ORGANIZATION AND SINGLE CELL OPERATION

(75) Inventors: Seiki Ogura, Hopewell Jct, NY (US); Tomoya Saito, Poughkeepsie, NY (US); Tomoko Ogura, Hopewell Jct, NY (US)

(73) Assignee: Halo LSI, Inc., Wappingers Fall, NJ (US)

( * ) Notice: Subject to any disclaimer, the term of this patent is extended or adjusted under 35 U.S.C. 154(b) by 0 days.

(21) Appl. No.: 10/190,634

(22) Filed: Jul. 8, 2002

(65) Prior Publication Data

US 2003/0022441 A1 Jan. 30, 2003

Related U.S. Application Data

(60) Provisional application No. 60/303,736, filed on Jul. 6, 2001.

(51) Int. Cl.⁷ .............................................. G11C 16/04
(52) U.S. Cl. .......................... 365/185.18; 365/230.04; 365/185.21
(58) Field of Search ................. 365/185.18, 230.04, 365/185.21, 185.26, 185.29, 185.14, 185.33

(56) References Cited

U.S. PATENT DOCUMENTS

| | | | |
|---|---|---|---|
| 5,986,934 A | * 11/1999 | Kao et al. ............... | 365/185.18 |
| 6,011,725 A | 1/2000 | Eitan ..................... | 365/185.33 |
| 6,134,156 A | 10/2000 | Eitan ..................... | 365/189.07 |
| 6,248,633 B1 | 6/2001 | Ogura et al. ............. | 438/267 |
| 6,459,622 B1 | 10/2002 | Ogura et al. ............ | 365/185.28 |
| 6,469,935 B2 | 10/2002 | Hayashi ................. | 365/185.18 |

* cited by examiner

*Primary Examiner*—David Lam
(74) *Attorney, Agent, or Firm*—George O. Saile; Stephen B. Ackerman

(57) ABSTRACT

In the present invention a twin MONOS metal bit line array is read and programmed using a three dimensional programming method with X, Y and Z dimensions. The word line address is the X address. The control gate line address is a function of the X and Z addresses, and the bit line address is a function of the Y and Z addresses. Because the bit lines and the control gate lines of the memory array are orthogonal a single cell can be erased with an adjacent memory, having the same selected bit and control gate lines, being inhibited from erase by application of the proper voltages to unselected word, control gate and bit lines.

35 Claims, 5 Drawing Sheets

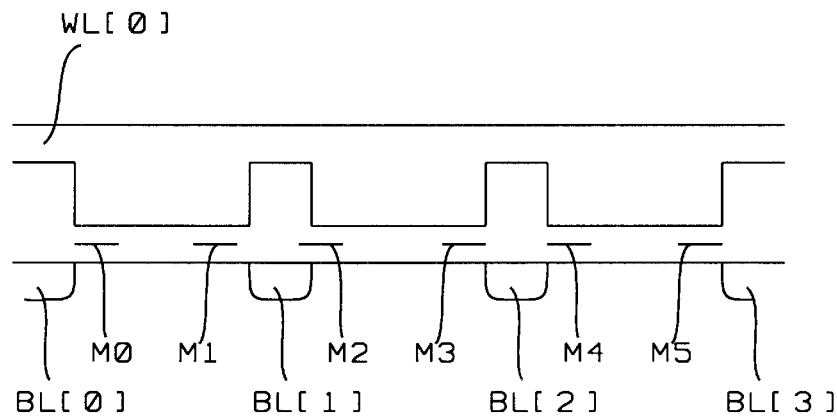
FIG. 1A — Prior Art
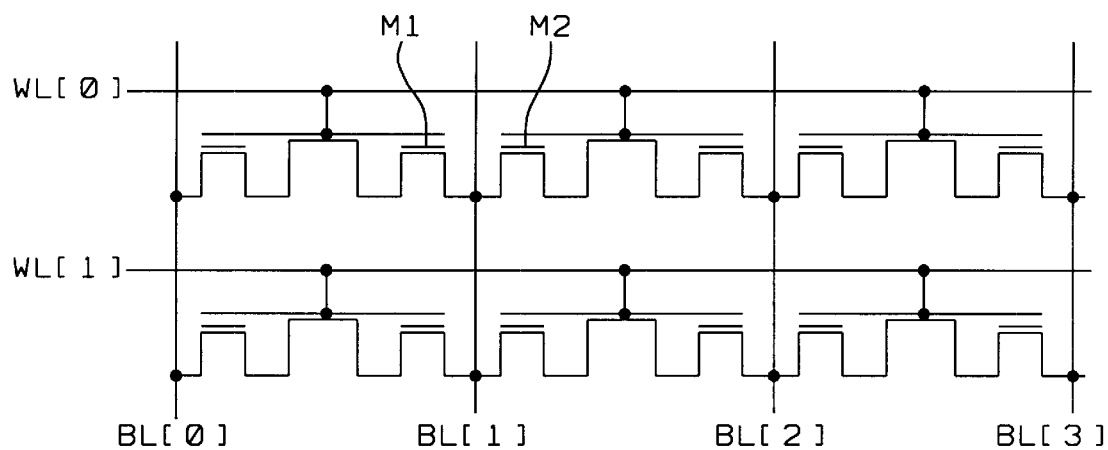
FIG. 1B — Prior Art

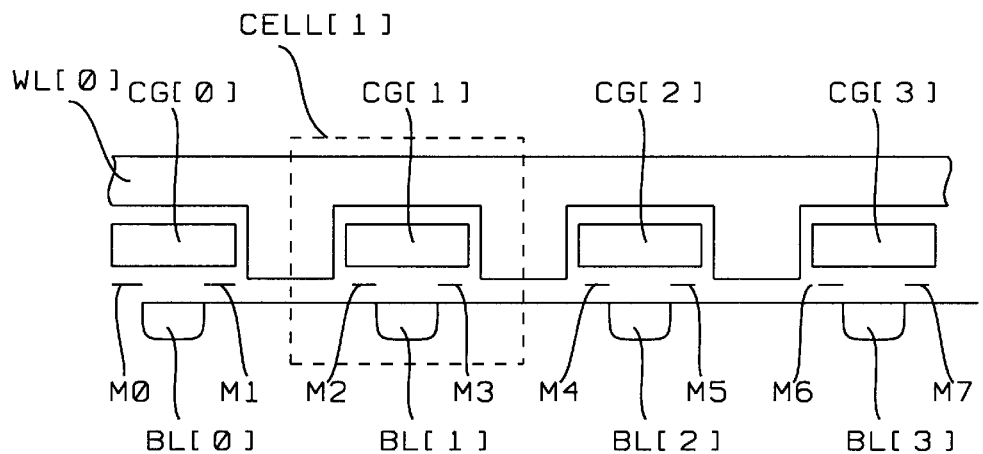
FIG. 2A – Prior Art
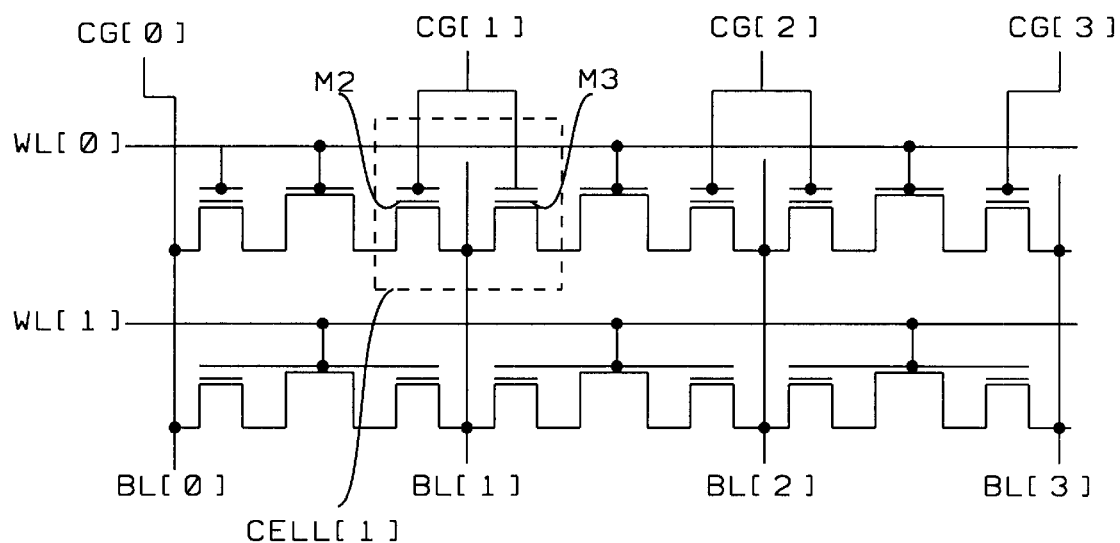
FIG. 2B – Prior Art

_US 6,631,088 B2_

TWIN MONOS ARRAY METAL BIT ORGANIZATION AND SINGLE CELL OPERATION

This application claims priority to Provisional Patent Application serial No. 60/303,736, filed on Jul. 6, 2001, which is herein incorporated by reference.

BACKGROUND OF THE INVENTION

1. Field of Invention

The present invention is related to semiconductor flash memories, and in particular to a twin MONOS flash metal bit array.

2. Description of Related Art

A MONOS EEPROM is comprised of an array of cells that can be independently programmed and read. Metal Oxide Semiconductor (MOS) field effect transistors form the individual memory units of MONOS EEPROM. The Flash MOS transistor includes a source, drain, and floating gate with a control gate connected to a Word Line (WL). Various voltages are applied to the word line and bit lines to program the cell with a binary "1" or "0", or to erase the cell.

U.S. Pat. No. 6,248,633 (Ogura et al) is directed toward a twin MONOS cell structure having an ultra short control gate channel with ballistic electron injection into the nitride storage sites and fast low voltage programming. U.S. Pat. No. 6,134,156 (Eitan) is directed toward a method of detecting the content of a selected memory cell including the charging of bit lines and drain lines. An array scheme shown in U.S. Pat. No. 6,011,725 (Eitan) is directed toward a polysilicon word line routed above the control gates of the cells connected to the word line WL, referred to as dual bit NROM cells. U.S. patent application Ser. No. 10/099,030 dated Mar. 15, 2002 is directed toward providing a method of memory cell selection and operation to obtain wide program bandwidth and EEPROM erase capability in a MONOS memory cell.

In FIG. 1A is shown a cross section of a dual bit NROM array of prior art with a word line WL0, bit line diffusions BL0, BL1, BL2 and BL3, and nitride storage sites M0, M1, M2, and M3. The schematic of the dual bit NROM array is shown in FIG. 1B. Bit lines and word lines run orthogonal to each other. In FIG. 2A is shown cross section of a twin MONOS array of prior art with bit diffusions BL0, BL1, BL2, and BL3, control gates CG0, CG1, CG2, and CG3, word line WL0 and nitride storage sites M0, M1, M2, M3, M4, M5, M6 and M7. Control gates, separate from the word lines lay above the nitride storage sites and the bit lines. FIG. 2B shows a schematic diagram of the twin MONOS array of prior art. In the conventional MONOS MOS transistor the programmable component under the control gate in the MONOS device is a nitride as shown in FIG. 2A. The twin MONOS memory unit is comprised of a control gate such as CG1 in CELLI[1] under which are two separate sites, such as M2 and M3, that are used as storage sites in composite nitride layers. The bit line diffusion, BL1, lies under the control gate, CG1, and an independent polysilicon word line, WL0, lies between the control gates of adjacent cells.

U.S. patent application Ser. No. 09/810,122, dated Mar. 19, 2001, is directed toward providing a twin MONOS memory cell organized in a metal bit array. In the metal bit twin MONOS array similar to that shown in FIG. 3 of the present invention, control gate lines run in parallel with the word lines in order to simplify the fabrication processing steps and masking levels. Thus the organization of the array must be arranged so that the metal bit lines run orthogonal to both the control gate lines and the word lines. The metal bit lines are connected by alternating contacts to the junction regions of the memory cells. The metal bit array is more similar to a folded bit line array. Control gate lines are parallel to and alternate with word lines. Due to the "L" shape of the memory cell, the bit line selection can not be independent of the control gate selection.

SUMMARY OF THE INVENTION

It is an objective of the present invention to provide a method of numbering and selection for the twin MONOS metal bit line memory array.

It is also an objective of the present invention to address a memory cell as a function of the word line, bit line and control gate of the twin MONOS metal bit line memory array.

It is yet an objective of the present invention to form a unique address that is a function of three dimensions of the twin MONOS metal bit line memory array.

It is another objective of the present invention to provide voltage conditions for the twin MONOS metal bit line array during a read operation.

It is yet another objective of the present invention to provide a method of voltage sensing while reading a cell of the twin MONOS metal bit line array.

It is still another objective of the present invention to provide a method of current sensing while reading a cell of the twin MONOS metal bit line array.

it is still yet another objective of the present invention to provide a method and voltages for a single cell erase operation.

A new method of selection and numbering for the metal bit memory array is introduced in the present invention. The address of a memory cell is the function of the word line, bit line and control gate. A unique set of address bits must incorporate all three dimensions in which the X dimension corresponds to the word line address, the Y dimension corresponds to the bit line address and the Z dimension corresponds to the control gate with an even and odd property.

BRIEF DESCRIPTION OF THE DRAWINGS

This invention will be described with reference to the accompanying drawings, wherein:

FIG. 1A shows a cross section of an array using a dual bit NROM cell of prior art, FIG. 1B is a schematic diagram of the dual bit NROM cell array of prior art.

FIG. 2A shows a cross section of an array using a twin MONOS diffusion bit cell of prior art, FIG. 2B is a schematic diagram of the diffusion bit cell Twin MONOS array of prior art.

DETAILED DESCRIPTION OF THE PREFERRED EMBODIMENT

Figure 3:
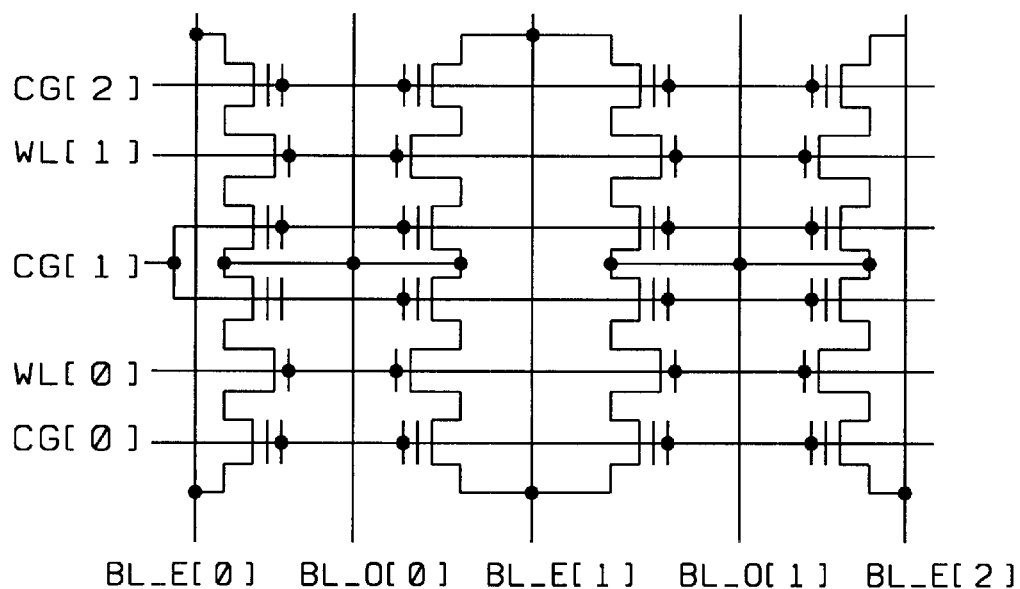
FIG. 3 is a schematic of a twin MONOS metal bit memory array of the present invention showing a labeling scheme.

FIG. 3 shows an example of a labeling scheme for a metal bit line array. Word lines WL[0] and WL[1], and control gate lines CG0, CG1 and CG2 run horizontally and alternate with each other. Bit lines run vertically and are labeled as BL_EV0, BL_OD[0], BL_EV[1], BL_OD[1], BL_EV[2], . . . The odd "_OD" and even "_EV" property of the bit line corresponds to the least significant bit of the selected control gate line. For a given word line and control gate address, the word line address number is determined by the X address. The control gate addressing is a function of both the X and Z addresses. The Table 1 summarizes the control gate addressing:

TABLE 1

| X | Y | Z | Selected Word Line | Selected Control Gate | Selected Bit Line |
|---|---|---|---|---|---|
| 0 | 0 | 0 | WL[0] | CG[0] | BL_EV[0] |
| 0 | 0 | 1 | WL[0] | CG[1] | BL_OD[0] |
| 1 | 0 | 0 | WL[0] | CG[2] | BL_EV[0] |
| 1 | 0 | 1 | WL[0] | CG[3] | BL_OD[0] |

If both X and Z are even, then CG[X] is selected. When either X or Z is odd, then CG[X+1] is chosen, and if both X and Z are odd, then CG[X+2] is chosen. Bit line selection is a function of Y and Z addresses. If the selected control gate line is even, then BL_EV[Y] will be chosen. Similarly, if the selected control gate line is odd, then BL_OD[Y] will be selected.

During read and program operations, a memory cell containing a pair of two hard bits is selected at one time within an I/O slice. A storage site is called a "hard bit", and I/O slice is defined as an array of memory cells that share a single pair of sense amplifiers or program latches. The number of memory cell columns in an I/O slice corresponds to the Y bit line decode.

Prior to any read, program or erase operation, the resting state of the memory may be as follows: all of the control gates and bit lines are biased to VDD, and all of the word lines are connected to GND. The p-well of the memory array is connected to GND. The purpose of applying the VDD voltage to all of the control gates and bit lines is for two reasons. First, the read access time is faster if the override control gate voltage is charged between VDD and VCGo, which is the control gate override voltage, instead of GND and VCGo. The second reason is that only by applying a high voltage to all of bit lines is it possible to read one memory cell without contaminating the signal with effects from the neighbor cell.

Figure 4:
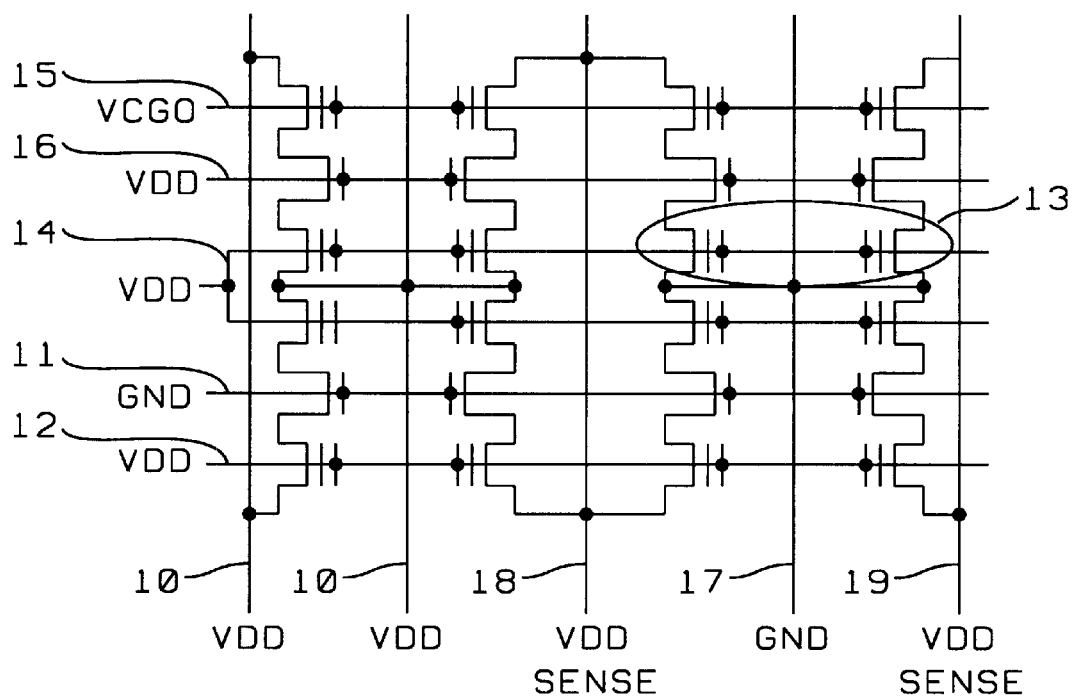
FIG. 4 is a schematic diagram of the present invention showing voltage conditions during a read operation.

FIG. 4 shows the voltage conditions of an I/O slice during read. The voltage conditions of the unselected cells are as follows: un selected bit lines 10 are at VDD, unselected word lines 11 are GND, and unselected control gates lines 12 are at VDD. When an X, Y, Z address is specified, one memory cell 13 is chosen from the I/O slice. The selected control gate line 14 is determined by the X and Z addresses, and remains biased to VDD, or floating near VDD, or is fixed to some voltage near VDD. If VDD is not sufficient to obtain memory cell current, the selected control gate line 14 may be biased to a voltage higher than VDD, but lower than the override voltage. The adjacent control gate line 15, designated as an override control gate, which is on the other side of the selected word line 16, is raised to VCGo (VCG override). The selected bit line 17, which is determined by Y and Z addresses, is pulled down to GND, or a low voltage.

The two bit lines 18 and 19, which are adjacent to the selected bit line17, are charged to VDD, then floated and connected to a sense amplifier (named VDD Sense). Raising the voltage on the selected word line 16 triggers the read operation. When the selected word line 16 is raised from GND to VDD, the voltage on the two floating bit lines 18 and 19 will either remain at VDD, or fall, depending on the threshold voltage of the memory bit. Although two memory bits are selected simultaneously, the signal on the two sensing bit lines 18 and 19 will develop independently of each other.

It should be noted that the default resting voltages for the CG lines and the bit lines was chosen to be VDD in order to minimize the number of voltage regulators. However, it may be practical to use other voltages lower or higher than VDD, for other reasons, such as faster performance or signal development. The main concern governing selection of the resting voltages for the CG and BL lines is that the BL voltage should be sufficiently high to inhibit the neighbor unselected cell's gate to source voltage.

During bit line signal development, if the sense bit line voltage falls below VDD minus the threshold voltage of the selected word gate, the Vt of the neighboring memory cell may start to affect the bit line signal, if it is programmed to a low threshold memory state. Thus, if voltage sensing is used, it is necessary to sense before the bit line voltage falls below VDD minus the threshold voltage of the memory cell word gate.

Figure 5:
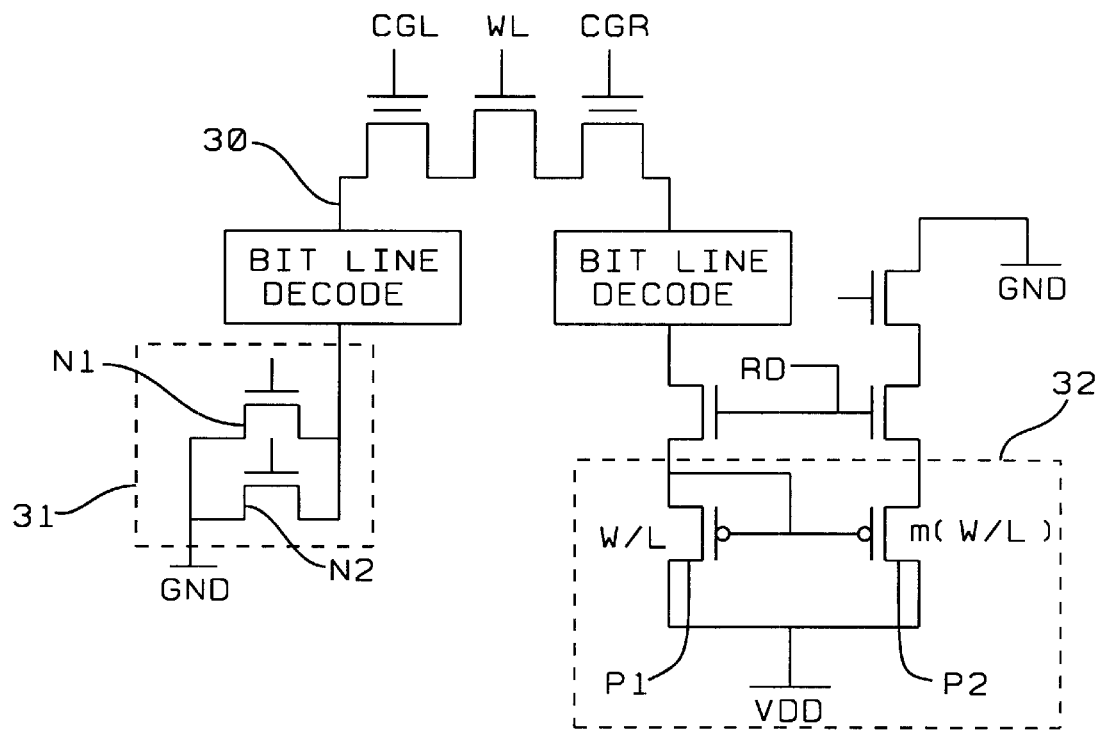
FIG. 5 shows a diagram of the present invention for sensing cell current in a twin MONOS metal bit array.

Another method of sensing the metal bit array is through current sensing. FIG. 5 shows the circuit path for current sensing. The sensing bit line 30 is connected to a source/drain of a decoupling NMOS transistor pair 31, and the other source/drain is connected to a PMOS current mirror 32. Gain may be added in the current mirror stage by setting the ratio of the source and mirror PMOS transistors, P1 and P2 respectively. W/L refers to the transistor strength ratio in which W is the transistor width and L is the transistor length. Current gain by a rough factor of m can be obtained in the mirror stage by increasing the ratio of W/L by the same factor of m. During current sensing, the voltage of the sensing BL is fixed to VDD-Vt-ntr, in which Vt-ntr is the threshold voltage of the nchannel pass transistors In order to prevent the neighboring cell from affecting the bit line signal, it is necessary to ensure the condition that Vt−ntr<= word gate Vt. In this current sensing scheme, the selected bit line is grounded. However, there are two transistors N1 and N2 which connect the bit line 30 to ground. Transistor N1 is a large W, small L device, which is used to pull down the bit line quickly for fast access time. Transistor N2 may be a smaller W or larger L device, which may be used during signal development to maintain a non-moving sensing bit line voltage. The device sizing is determined in order to balance with the pull up transistor P1 on the sensing bit line. If the N2 transistor is too strong, then the sensing bit line will move down.

Figure 6:
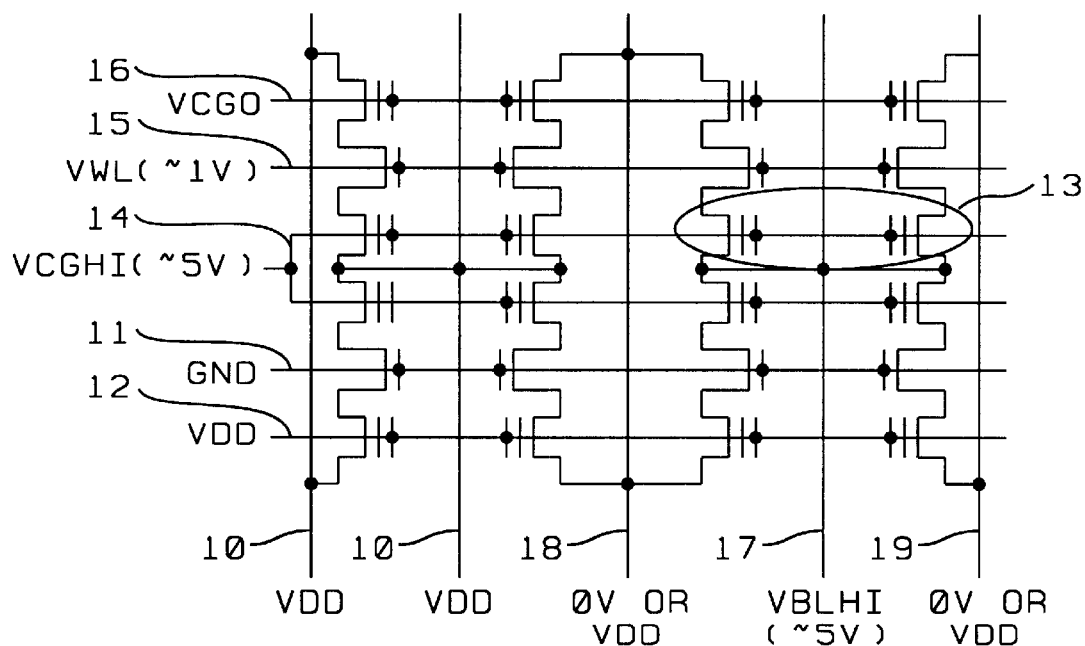
FIG. 6 is a schematic diagram of the present invention showing the voltages applied to a MONOS metal bit line array for a program operation.

FIG. 6 shows the voltages on the metal bit line array for program mode. The same set of bit lines and control gates are selected as for the read operation shown in FIG. 4 with the same set of unselected word line, bit line and control gate line voltages. The unselected bit lines 10 are set to VDD, the unselected control gate line is set to VDD, and the unselected word line is set to ground (GND). The adjacent control gate line 16 on the opposite side of the selected word line 15 from the selected control gate line 14 is connected to an override voltage VCGo. The selected control gate 14 and the selected bit line 17 are raised to a high voltage of approximately around 5V. The selected word line 15 is connected to a low voltage of approximately 1V. The two sensing bit lines 18 and 19 are connected to two program latches which will pull the bit lines down to GND, or near GND, for "0" program data. If the data in the program latch is a "1", the sensing bit line voltage will remain at VDD, and the memory cell will not be programmed because the word gate voltage minus the source voltage is less than Vth of the memory cell. The voltage of the selected word line 15 is set low to limit the cell current to a range of approximately 3–5 uA by a word gate voltage in the range of approximately 0V to 1.3V.

Figure 7:
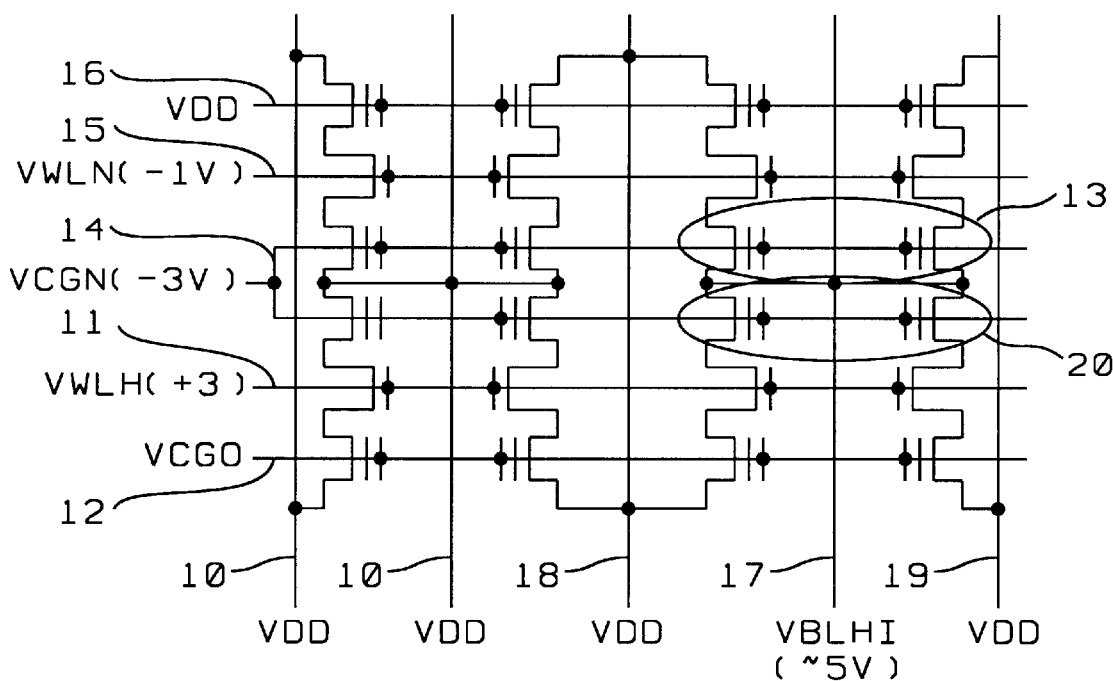
FIG. 7 is a schematic diagram of the present invention showing the voltages applied to a MONOS metal bit line array for a single cell erase operation.

There are several ways to divide the metal diffusion twin MONOS array for erase. The most conventional way is by block sizes of 128 kb or greater. However, in addition to the conventional flash erase, the metal diffusion twin MONOS array has the unique ability to select a minimum erase block size of one memory cell (containing two hard bits). FIG. 7 shows suggested voltage conditions for a single memory cell erase 13, and erase inhibit of the neighbor memory cell 20. The control gate line 16 on the opposite side of the selected word line 15 remains at the resting voltage, around VDD, and the selected word line 15 is set to approximately −1V. The selected control gate line 14 is set to approximately −3V and the override control gate line 12 is set to VCGO. The selected bit line 17 is biased to a high voltage VBLHI of around 4 to 5V. With these voltage conditions, memory cell 13 can be erased by a combination of F-N tunneling and hot hole erase. Hot holes are generated at the edge of the high voltage junction and swept into the nitride to recombine with the trapped electrons. The negative word line voltage induces a negative word gate channel voltage by capacitive coupling, which further accelerates hot hole erase, especially near the word gate, which is further from the high voltage junction. Unselected memory cell 20 shares the same high voltage bit line and negative control gate line as the selected memory cell 13. However, hot hole injection is inhibited by the following additional voltage conditions: The word line 11 on the opposite side of the selected control gate line 14 from the selected word line 15 is set to approximately +3V. The unselected bit lines 10 remain at the resting voltage, around VDD, and the bit lines 18 and 19 adjacent to the selected bit line 17 are also maintained to around VDD. The single cell erase is possible because the selected control gate line 14 is orthogonal to the selected bit line 17, which allows the selection of two memory cells 13 and 20. In these two memory cells, erase can be inhibited in one cell 20 by passing a positive voltage from bit lines 18 and 19, under the overridden control gates of control gate line 12, and under the positively biased word gates connected to word line 11. The voltage at the high voltage erase junction connected to bit line 17 will be reduced. A channel voltage under the word gate, close to the high voltage junction of approximately 1V instead of 0V reduces the generation of hot holes and thus erase does not occur.

While the invention has been particularly shown and described with reference to preferred embodiments thereof, it will be understood by those skilled in the art that various changes in form and details may be made without departing from the spirit and scope of the invention.

What is claimed is:
1. An addressing method for a twin MONOS metal bit line array, comprising:
   a) labeling word lines from a low word line address to a high word line address,
   b) labeling control gate lines from a low control gate address to a high control gate address,
   c) labeling bit lines from a low bit line address number to a high bit line address number with an additional designation as "even" and "odd" for each said address number,
   d) selecting a set of three dimensional addresses "X", "Y" and "Z",
   e) selecting said word line address as the "X" address,
   f) selecting said control gate address as a function of the "X" and the "Z" addresses,
   g) selecting said bit line address as a function of the "Y" and "Z" addresses and whether the control gate address is "even" or "odd".

2. The addressing method of claim 1, wherein selecting said control gate address further comprises:
   a) said control gate address is CG[X] when addresses "X" and "Z" are both "even",
   b) said control gate address is CG[x+1] when either address "X" or "Z" are "odd",
   c) said control gate address is CG[X+2] when both addresses "X" and "Z" are "odd".

3. The addressing method of claim 1, wherein selecting said bit line address further comprises:
   a) said bit line address is BL_EVEN[Y] when the selected control gate address is "even",
   b) said bit line address is BL_ODD[Y] when the selected control gate address is "odd".

4. The addressing method of claim 1, wherein said word line and said control gate lines run in a same direction and alternate with each other.

5. The addressing method of claim 1, wherein said bit lines are orthogonal to said word lines and control gate lines, and said bit lines designated as "even" alternate with said bit lines designated as "odd".

6. A method for reading storage sites of a twin MONOS metal bit line memory array, comprising:
   a) specifying an "X", "Y" and "Z" address for a selected cell containing two storage sites,
   b) coupling a selected control gate line to said array chip voltage bias VDD,
   c) coupling an override control gate line to an override voltage,
   d) coupling a selected bit line to ground, or near ground potential,
   e) charging a first bit line and a second bit line that are adjacent to said selected bit line to said array chip voltage bias VDD, connecting said first bit line to a first sense amplifier and said second bit line to a second sense amplifier, and then floating said first and second sense amplifiers,
   f) raising a voltage on a selected word line from a low voltage to said array chip voltage bias VDD,
   g) reading stored data of said first storage site on said first adjacent bit line, and reading stored data of said second storage site on said second adjacent bit line.

7. The method for reading storage sites in claim 6 further comprising:
   a) coupling unselected bit lines to an array chip voltage bias VDD,
   b) coupling unselected word lines to ground, or near ground potential,
   c) coupling unselected control gate lines to said array chip voltage bias VDD.

8. The method for reading storage sites in claim 6, wherein said "X" address specifies the selected word line, said "X" and "Z" addresses specifies the selected control gate line and said "Y" and "Z" addresses along with an "even" or "odd" designation of an address of said selected control gate line specifies the selected bit line.

9. The method for reading storage sites in claim 6, wherein said override control gate line is located on the opposite side of the selected word line from said selected control gate line.

10. The method for reading storage sites in claim 6, wherein said first adjacent bit line is located on a first side of said selected bit line and said second adjacent bit line is located on a second side of said selected bit line.

11. The method for reading storage sites in claim 6, wherein raising the voltage on the selected word line triggers a read operation and results in a voltage of said first and second adjacent bit lines to be a value determined separately by a threshold voltage of said first and second storage sites.

12. A method for programming a metal bit line twin MONOS metal bit line array, comprising:
   a) specifying an "X", "Y" and "Z", address for a selected cell containing two storage sites,
   b) coupling a selected control gate line to a high positive voltage,
   c) coupling an override control gate line to an override voltage,
   d) coupling a selected bit line to said high positive voltage,
   e) coupling a selected word line to a low positive voltage,
   f) connecting a first sensing bit line to a first program latch and connecting a second sensing bit line to a second program latch.

13. The method of programming of claim 12 further comprising:
   a) coupling unselected bit lines to an array chip voltage bias VDD,
   b) coupling unselected word lines to ground, or near ground potential,
   c) coupling unselected control gate lines to said array chip voltage bias VDD.

14. The method of programming of claim 12, wherein connecting said first and second program latch to said first and second sensing bit lines produces said VDD voltage on said first and second sensing bit lines when the data to be programmed is a logical "1".

15. The method of programming of claim 12, wherein connecting said first and second program latch to said first and second sensing bit lines produces a low voltage on said first and second sensing bit lines when the data to be programmed is a logical "0".

16. The method of programming of claim 12, wherein coupling said selected word line to said low positive voltage limits a selected memory cell current to a few microamperes.

17. A method of single cell erase for a twin MONOS metal bit line memory array, comprising:
   a) coupling a selected word line to a low negative voltage,
   b) coupling a selected control gate to a high negative voltage,
   c) coupling a selected bit line to a high positive voltage,
   d) coupling an unselected word line on an opposite side of the selected control gate line from said selected word line to a high negative voltage,
   e) coupling an override control gate line to an override voltage,
   f) coupling an unselected control gate line on the opposite side of the selected word line from the selected control gate line to a positive array bias voltage.

18. The method of single cell erase of claim 17 further comprising;
   a) coupling unselected bit lines to said positive array bias voltage,
   b) coupling bit lines adjacent to said selected bit line to said positive array bias voltage.

19. The method of single cell erase of claim 17, wherein coupling said low negative voltage to said selected word line accelerates an erase speed of said selected cell.

20. The method of single cell erase of claim 17, wherein said selected control gate line and said selected bit line are orthogonal which allows a selection of a single memory cell.

21. The method of single cell erase of claim 20, wherein a first of said two selected memory cells is inhibited from erase by a voltage passed through an erase drain region of said second of said two selected cells.

22. A means for addressing a twin MONOS metal bit line array, comprising:
   a) a means for a three dimensional address,
   b) a means for addressing a word line as an address of said three dimensional address,
   c) a means for addressing a control gate line as a first pair of addresses of said three dimensional address,
   d) a means for addressing a bit line as a second pair of addresses of said three dimensional address.

23. The means for addressing a twin MONOS metal bit line array of claim 22, wherein said means for addressing said control gate line is dependent upon an odd or even state of said first pair of addresses of said three dimensional address.

24. The means for addressing a twin MONOS metal bit line array of claim 22, wherein said means for addressing said bit line is dependent upon an odd or even state of the address of the control gate line.

25. A means for reading storage sites of a twin MONOS metal bit line array, comprising:
   a) a means for addressing a cell of a twin MONOS metal bit line array containing a first and a second storage site,
   b) a means for applying a control gate select voltage to a selected control gate line,
   c) a means for applying a bit line select voltage to a selected bit line,
   d) a means for charging a first and a second bit line to an array bias voltage and floating said first and second bit lines,
   e) a means for detecting a value of data stored in said two storage sites as a selected word line voltage is raised from a low voltage to a higher voltage.

26. The means for reading storage sites of claim 25, wherein said means for addressing a cell of a twin MONOS metal bit array uses a three dimensional address.

27. The means for reading storage sites of claim 25, wherein said first and second bit lines are adjacent to said selected bit line.

28. The means for reading storage sites of claim 25, wherein said first and second bit lines connect voltages to a first and a second sense amplifier that represent a store value in said first and second storage sites.

29. A means for programming storage sites of a twin MONOS metal bit line array, comprising:
   a) a means for addressing a cell of a twin MONOS metal bit line array containing a first and a second storage site,
   b) a means for applying a control gate select voltage of a high positive value to a selected control gate line,
   c) a means for applying a bit line select voltage of a high positive value to a selected bit line, d) a means for applying a word line voltage of a low positive value to a selected word line, e) a means for coupling a first data value on a first program latch to a first sensing bit line, f) a means for coupling a second data value on a second program latch to a second sensing bit line.

30. The means for programming storage sites of claim 29, wherein said means for addressing a cell of a twin MONOS metal bit array uses a three dimensional address.

31. The means for programming storage sites of claim 29, wherein said first and second sensing bit lines are adjacent to said selected bit line.

32. A means for single cell erase of a twin MONOS metal bit line array, comprising:

a) a means for addressing a cell of a twin MONOS metal bit line array containing a first and a second storage site, b) a means for applying a control gate select voltage of a negative value to a selected control gate line, c) a means for applying a bit line select voltage of a high positive value to a selected bit line, d) a means for applying a word line voltage of a low negative value to a selected word line, e) a means for inhibiting from erase an adjacent memory cell using a same selected bit line and a same selected control gate line.

33. The means for single cell erase of claim 32, wherein said means for addressing a cell of a twin MONOS metal bit array uses a three dimensional address.

34. The means for single cell erase of claim 32, wherein said selected control gate line and said selected bit line are orthogonal which allows selection of a single memory cell.

35. The means of single cell erase of claim 32, wherein applying to said word line said low negative voltage accelerates an erase speed of said selected cell.

* * * * *